(12) United States Patent
Su et al.

(10) Patent No.: US 8,587,013 B2
(45) Date of Patent: Nov. 19, 2013

(54) SEMICONDUCTOR PACKAGE STRUCTURE

(71) Applicants: Po-Jen Su, Tainan (TW); Chih-Ling Wu, Tainan (TW); Yi-Ru Huang, Tainan (TW); Yi-Ju Shih, Tainan (TW)

(72) Inventors: Po-Jen Su, Tainan (TW); Chih-Ling Wu, Tainan (TW); Yi-Ru Huang, Tainan (TW); Yi-Ju Shih, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/670,438

(22) Filed: Nov. 6, 2012

(65) Prior Publication Data
US 2013/0153944 A1   Jun. 20, 2013

(30) Foreign Application Priority Data
Dec. 16, 2011   (TW) .............................. 100146900 A

(51) Int. Cl.
*H01L 33/00* (2010.01)
(52) U.S. Cl.
USPC ........................ 257/98; 257/99; 257/E33.066

(58) Field of Classification Search
USPC ......................................... 257/98, 99, E33.066
See application file for complete search history.

(56) References Cited

U.S. PATENT DOCUMENTS

2005/0168992 A1*   8/2005   Hirose .......................... 362/296

* cited by examiner

*Primary Examiner* — Tan N Tran
(74) *Attorney, Agent, or Firm* — Jianq Chyun IP Office

(57) ABSTRACT

A semiconductor package structure includes an insulating substrate, a patterned conductive layer, a light emitting diode (LED) chip and a conductive connection part. The insulating substrate has an upper surface divided into an element configuration region and an element bonding region. The patterned conductive layer includes plural circuits located in the element configuration region and at least one bonding pad located in the element bonding region. The LED chip is flip chip bonded on the patterned conductive layer and electrically connected to the circuits. The conductive connection part has a first end point electrically connected to the bonding pad and a second end point electrically connected to an external circuit. The bonding pad and a corner of the LED chip are disposed correspondingly. A horizontal distance between an apex of the corner and the first end point of the conductive connection part is greater than or equal to 30 micrometers.

11 Claims, 4 Drawing Sheets

SEMICONDUCTOR PACKAGE STRUCTURE

CROSS-REFERENCE TO RELATED APPLICATION

This application claims the priority benefit of Taiwan application serial no. 100146900, filed on Dec. 16, 2011. The entirety of the above-mentioned patent application is hereby incorporated by reference herein and made a part of this specification.

BACKGROUND OF THE INVENTION

1. Field of the Invention

The present invention generally relates to a semiconductor element, in particular, to a semiconductor package structure.

2. Description of Related Art

An objective of chip package is to protect an exposed chip, lower a density of a chip contact, and provide excellent heat dissipation to the chip. A common packaging method is that the chip is installed on a package carrier plate through a wire bonding or flip chip bonding manner, so that the contacts of the chip may be electrically connected to the package carrier plate. Therefore, distribution of the contacts of the chip may be reconfigured through the package carrier plate, so as to satisfy the distribution of the contacts of external elements of a next layer.

However, recently, when the package carrier plate adopting the flip chip bonding is directly converted to the package carrier plate adopting the wire bonding, a position of a bonding pad is near a side surface of the chip. That is to say, if the chip is a light emitting diode (LED) chip, the position of the bonding pad is near a light emitting surface of the chip. In this manner, when the bonding wire is disposed on the bonding pad, the bonding wire may absorb the light emitted by the LED, so as to lower a light emitting efficiency of an entire package structure.

SUMMARY OF THE INVENTION

Accordingly, the present invention is directed to a semiconductor package structure, having a preferable light emitting efficiency.

The present invention provides a semiconductor package structure, which includes an insulating substrate, a patterned conductive layer, an LED chip, and a conductive connection part. The insulating substrate has an upper surface, in which the upper surface is divided into an element configuration region and an element bonding region located on an outer side of the element configuration region. The patterned conductive layer is configured on the insulating substrate, and includes a plurality of circuits and at least one bonding pad, in which the circuits are located in the element configuration region, and the bonding pad is located in the element bonding region. The LED chip is flip chip bonded on the patterned conductive layer and is located in the element configuration region, in which the LED chip is electrically connected to the circuits. The conductive connection part is configured on the patterned conductive layer, and is located in the element bonding region. The conductive connection part has a first end point and a second end point, in which the first end point is electrically connected to the bonding pad, and the second end point is electrically connected to an external circuit. An orthographic projection of the LED chip on the patterned conductive layer is a rectangle, and the bonding pad and a corner of the rectangle are disposed correspondingly. A horizontal distance between an apex of the corner and the first end point of the conductive connection part is greater than or equal to 30 micrometers ($\mu m$).

In an embodiment of the present invention, the insulating substrate is a transparent insulating substrate.

In an embodiment of the present invention, the LED chip includes a chip substrate, a semiconductor layer, and a plurality of contacts. The semiconductor layer is located between the chip substrate and the contacts, and the contacts connect the patterned conductive layer.

In an embodiment of the present invention, the LED chip further includes a reflective layer, configured between the semiconductor layer and the contacts.

In an embodiment of the present invention, the horizontal distance between the apex of the corner and the first end point of the conductive connection part is smaller than or equal to 1 millimeter (mm).

In an embodiment of the present invention, the conductive connection part includes a bonding wire or an electrical wire.

In an embodiment of the present invention, the external circuit includes a lead frame, a circuit substrate, or a printed circuit board.

In an embodiment of the present invention, the patterned conductive layer is located on the upper surface of the insulating substrate.

In an embodiment of the present invention, the patterned conductive layer is embedded in the upper surface of the insulating substrate, and a surface of the patterned conductive layer and the upper surface of the insulating substrate are coplanar.

In an embodiment of the present invention, the semiconductor package structure further includes a protecting layer, configured on the patterned conductive layer, and covering a part of the bonding pad and a part of the upper surface.

In an embodiment of the present invention, the bonding pad is electrically connected to one of the circuits.

Based on the above mentioned, a bonding pad of the present invention and a corner of an orthographic projection (that is, a rectangle) of an LED chip on a patterned conductive layer are correspondingly disposed, and a horizontal distance between an apex of the corner and an end point of a conductive connection part is greater than or equal to 30 $\mu m$. In other words, the LED chip and the conductive connection part are spaced by a certain distance, and a position of the bonding pad is at a place where a light emitting intensity of the LED chip is relatively weak, so as to lower possibility that a conductive connection part absorbs light emitted by the LED chip, so that an entire semiconductor package structure of the present invention may have a preferable light emitting efficiency.

In order to make the aforementioned features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
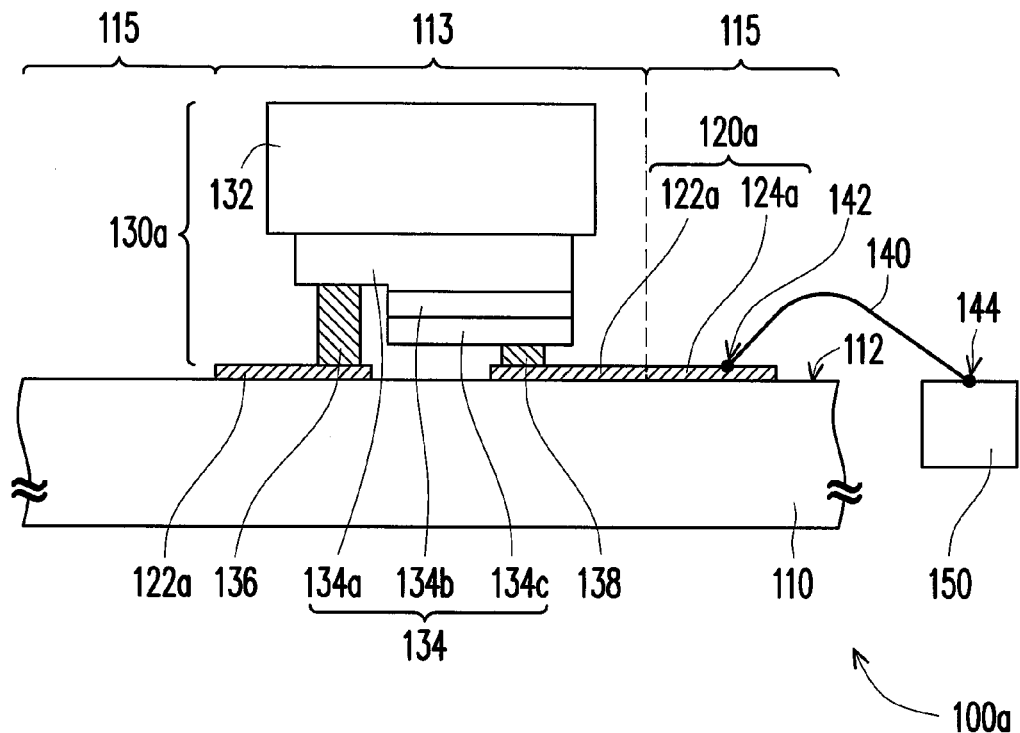
FIG. 1A is a schematic cross-sectional view of a semiconductor package structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 1B:
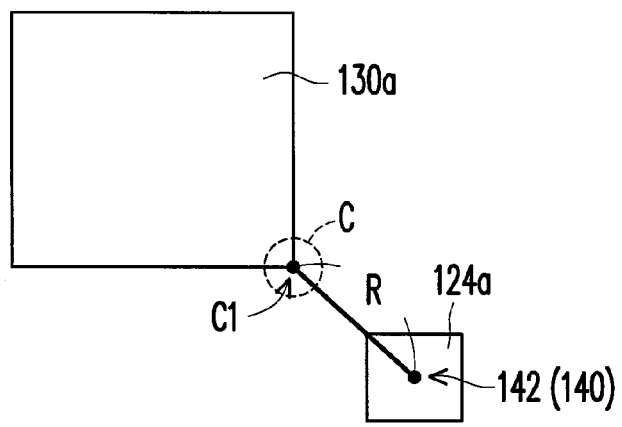
FIG. 1B is a schematic top view of a relative relationship among an LED chip, a bonding pad, and a conductive connection part of FIG. 1A.

FIG. 1A is a schematic cross-sectional view of a semiconductor package structure according to an embodiment of the present invention. FIG. 1B is a schematic top view of a relative relationship among an LED chip, a bonding pad, and a conductive connection part of FIG. 1A. Referring to FIGS. 1A and 1B, in this embodiment, the semiconductor package structure 100a includes an insulating substrate 110, a patterned conductive layer 120a, an LED chip 130a, and a conductive connection part 140.

In detail, the insulating substrate 110 has an upper surface 112, in which the upper surface 112 may be divided into an element configuration region 113 and an element bonding region 115 located on an outer side of the element configuration region 113. The patterned conductive layer 120a is configured on the insulating substrate 110, and is located on the upper surface 112. The patterned conductive layer 120a includes a plurality of circuits 122a and at least one bonding pad 124a (only one is schematically shown in FIGS. 1A and 1B), in which the circuits 122a are located in the element configuration region 113, the bonding pad 124a is located in the element bonding region 115, and the bonding pad 124a is connected to one of the circuits 122a.

The LED chip 130a is flip chip bonded on the patterned conductive layer 120a, and is located in the element configuration region 113, in which the LED chip 130a is electrically connected to the circuits 122a. More particularly, the LED chip 130a includes a chip substrate 132, a semiconductor layer 134, and a plurality of contacts 136, 138, in which the semiconductor layer 134 is located between the chip substrate 132 and the contacts 136, 138, and the contacts 136, 138 connect the patterned conductive layer 120a. In addition, the semiconductor layer 134 includes an N-type doping layer 134a, a light emitting layer 134b, and a P-type doping layer 134c. The light emitting layer 134b is located between the N-type doping layer 134a and the P-type doping layer 134c, and the contacts 136, 138 are respectively electrically connected to the N-type doping layer 134b and the P-type doping layer 134c. It should be noted that in order to increase a light extraction efficiency, it is necessary to prevent light rays emitted by the light emitting layer 134b of the LED chip 130a from being absorbed by the insulating substrate 110, so that the insulating substrate 110 may be, for example, a transparent insulating substrate, and a material of the transparent insulating substrate includes aluminium nitride or sapphire.

The conductive connection part 140 is configured on the patterned conductive layer 120a, and is located in the element bonding region 115. The conductive connection part 140 has a first end point 142 and a second end point 144, in which the first end point 142 is electrically connected to the bonding pad 124a, and the second end point 144 is electrically connected to an external circuit 150. Here, the conductive connection part 140 is, for example, a bonding wire or an electrical wire, and the external circuit 150 is, for example, a lead frame, a circuit substrate, or a printed circuit board.

Particularly, an orthographic projection of the LED chip 130a of this embodiment on the patterned conductive layer 120a is a rectangle, and the bonding pad 124a and a corner C of the rectangle are correspondingly disposed, and a horizontal distance R between an apex C1 of the corner C and the first end point 142 of the conductive connection part 140 is greater than or equal to 30 μm. In other words, on a profile of a ¾ round with the apex C1 of the corner C serving as a centre and the horizontal distance R as a radius, the conductive connection part 140 may be disposed. Preferably, the horizontal distance R between the apex C1 of the corner C and the first end point 142 of the conductive connection part 140 is smaller than or equal to 1 mm. It should be noted that although an appearance of the bonding pad 124a shown in FIG. 1B is substantially the rectangle, in other not shown embodiments, the appearance of the bonding pad 124a may be round or other suitable polygons, and is not limited here.

The bonding pad 124a of this embodiment and the corner C of the orthographic projection (that is, the rectangle) of the LED chip 130a on the patterned conductive layer 120a are correspondingly disposed, and the horizontal distance R between the apex C1 of the corner C and the first end point 142 of the conductive connection part 140 is greater than or equal to 30 μm. That is to say, the LED chip 130a and the conductive connection part 140 are spaced by a certain distance, and the position of the bonding pad 124a is at the place where the light emitting intensity of the LED chip 130a is relatively weak (that is, the corner C), so as to effectively lower the possibility that the conductive connection part 140 absorbs the light emitted by the LED chip 130a, so that the entire semiconductor package structure 100a of this embodiment may have a preferable light emitting efficiency.

It should be noted that in the following embodiments, element numerals and a part of content of the above embodiment are used, in which the same numerals are used to represent the same or similar elements, and description of the same technical content is omitted. For the description of the omitted part, please refer to the above embodiment, and description is not given in the following embodiments.

Figure 2:
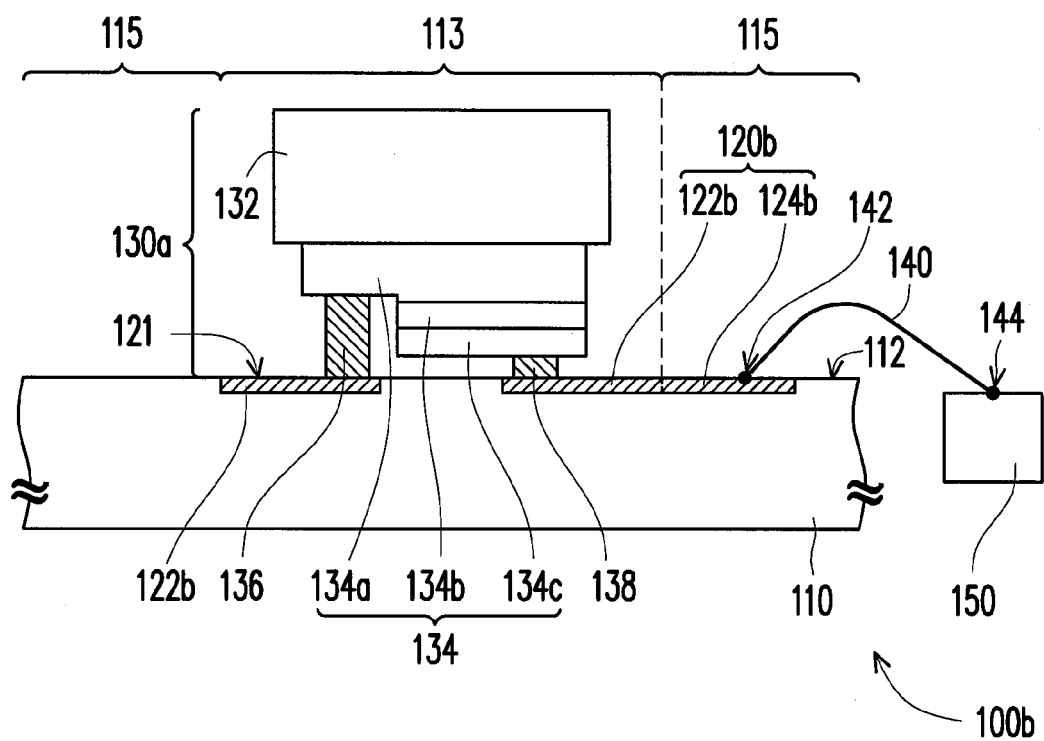
FIG. 2 is a schematic cross-sectional view of a semiconductor package structure according to another embodiment of the present invention.

FIG. 2 is a schematic cross-sectional view of a semiconductor package structure according to another embodiment of the present invention. Referring to FIG. 2, the semiconductor package structure 100b of this embodiment is similar to the semiconductor package structure 100a of FIG. 1A, except that a patterned conductive layer 120b of the semiconductor package structure 100b of this embodiment is embedded in an upper surface 112 of an insulating substrate 110, that is, circuits 122b and a bonding pad 124b are embedded in the upper surface 112 of the insulating substrate 110, and a surface 121 of the patterned conductive layer 120b and the upper surface 112 of the insulating substrate 110 are substantially coplanar. In this manner, the semiconductor package structure 100b may have a thinner thickness, so as to satisfy a current thinning development trend.

Figure 3:
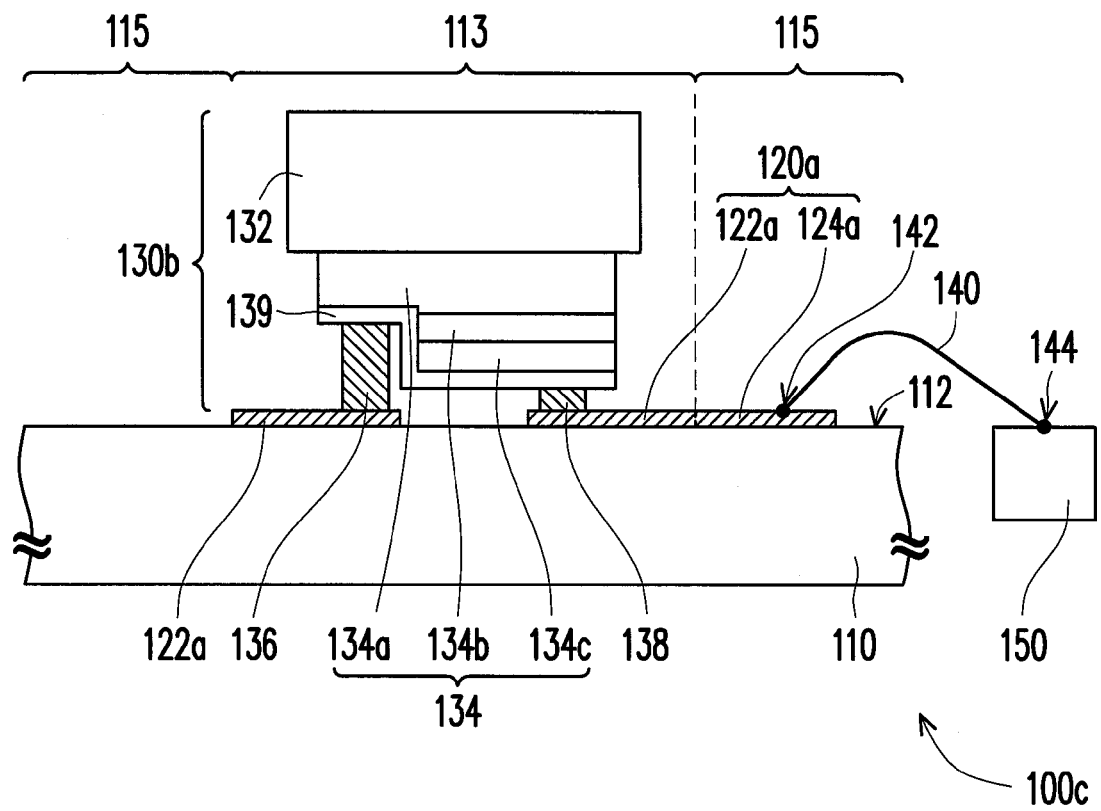
FIG. 3 is a schematic cross-sectional view of a semiconductor package structure according to another embodiment of the present invention.

FIG. 3 is a schematic cross-sectional view of a semiconductor package structure according to another embodiment of the present invention. Referring to FIG. 3, the semiconductor package structure 100c of this embodiment is similar to the semiconductor package structure 100a of FIG. 1A, except that an LED chip 130b of the semiconductor package structure 100c of this embodiment further includes a reflective layer 139, in which the reflective layer 139 is configured between a semiconductor layer 134 of the LED chip 130b and contacts 136, 138, so as to increase a light emitting performance of the LED chip 130b, so that the semiconductor package structure 100c has a preferable light emitting efficiency.

Figure 4:
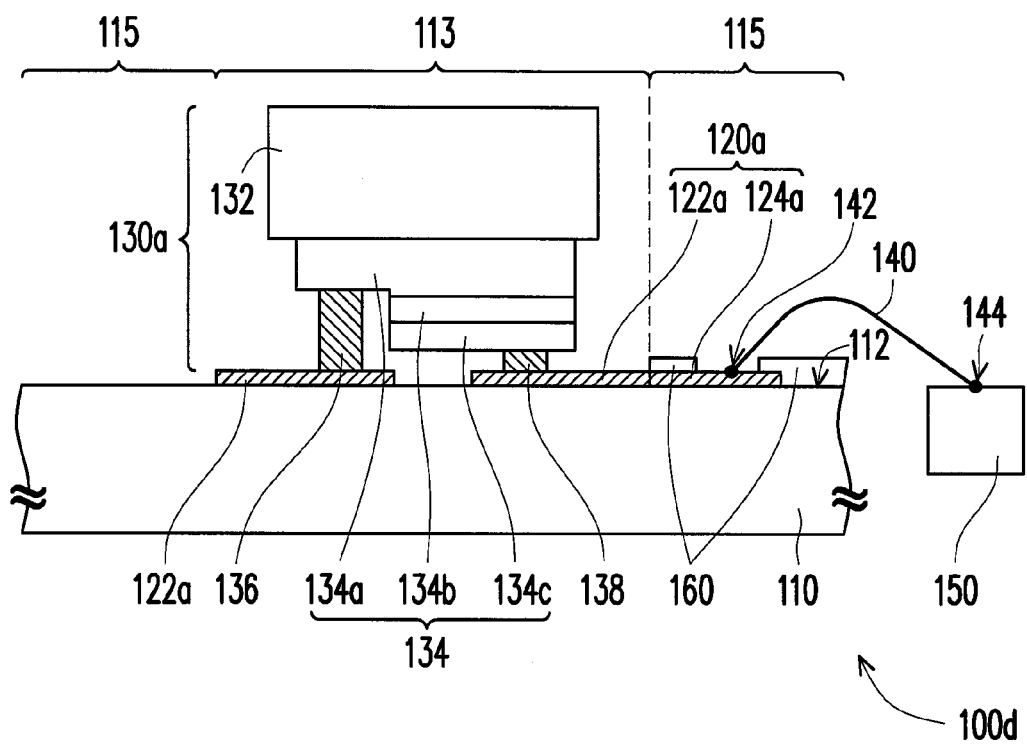
FIG. 4 is a schematic cross-sectional view of a semiconductor package structure according to another embodiment of the present invention.

FIG. 4 is a schematic cross-sectional view of a semiconductor package structure according to another embodiment of the present invention. Referring to FIG. 4, the semiconductor package structure 100d of this embodiment is similar to the semiconductor package structure 100a of FIG. 1A, except that the semiconductor package structure 100d of this embodiment further includes a protecting layer 160, in which the protecting layer 160 is configured on a patterned conductive layer 120a, and covers a part of a bonding pad 124a and a part of an upper surface 112 of an insulating substrate 110, so as to protect the patterned conductive layer 120a and a first end 142 of a conductive connection part 140.

To sum up, a bonding pad of the present invention and a corner of an orthographic projection (that is, a rectangle) of an LED chip on a patterned conductive layer are correspondingly disposed, and a horizontal distance between an apex of the corner and an end point of a conductive connection part is greater than or equal to 30 μm. In other words, the LED chip and the conductive connection part are spaced by a certain distance, and a position of the bonding pad is at a place where a light emitting intensity of the LED chip is relatively weak, so as to lower possibility that a conductive connection part absorbs light emitted by the LED chip, so that an entire semiconductor package structure of the present invention may have a preferable light emitting efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package structure, comprising:
    an insulating substrate, comprising an upper surface, wherein the upper surface is divided into an element configuration region and an element bonding region located on an outer side of the element configuration region;
    a patterned conductive layer, configured on the insulating substrate, and comprising a plurality of circuits and at least one bonding pad, wherein the circuits are located in the element configuration region, and the bonding pad is located in the element bonding region;
    a light emitting diode (LED) chip, flip chip bonded on the patterned conductive layer, and located in the element configuration region, wherein the LED chip is electrically connected to the circuits; and
    a conductive connection part, configured on the patterned conductive layer, and located in the element bonding region, wherein the conductive connection part comprises a first end point and a second end point, the first end point is electrically connected to the bonding pad, and the second end point is electrically connected to an external circuit, wherein an orthographic projection of the LED chip on the patterned conductive layer is a rectangle, the bonding pad and a corner of the rectangle are correspondingly disposed, and a horizontal distance between an apex of the corner and the first end point of the conductive connection part is greater than or equal to 30 micrometers (μm).

2. The semiconductor package structure according to claim 1, wherein the insulating substrate is a transparent insulating substrate.

3. The semiconductor package structure according to claim 1, wherein the LED chip comprises a chip substrate, a semiconductor layer, and a plurality of contacts, the semiconductor layer is located between the chip substrate and the contacts, and the contacts connect the patterned conductive layer.

4. The semiconductor package structure according to claim 3, wherein the LED chip further comprises a reflective layer, configured between the semiconductor layer and the contacts.

5. The semiconductor package structure according to claim 1, wherein the horizontal distance between the apex of the corner and the first end point of the conductive connection part is smaller than or equal to 1 millimeter (mm).

6. The semiconductor package structure according to claim 1, wherein the conductive connection part comprises a bonding wire or an electrical wire.

7. The semiconductor package structure according to claim 1, wherein the external circuit comprises a lead frame, a circuit substrate, or a printed circuit board.

8. The semiconductor package structure according to claim 1, wherein the patterned conductive layer is located on the upper surface of the insulating substrate.

9. The semiconductor package structure according to claim 1, wherein the patterned conductive layer is embedded in the upper surface of the insulating substrate, and a surface of the patterned conductive layer and the upper surface of the insulating substrate are coplanar.

10. The semiconductor package structure according to claim 1, further comprising a protecting layer, configured on the patterned conductive layer, and covering a part of the bonding pad and a part of the upper surface.

11. The semiconductor package structure according to claim 1, wherein the bonding pad is electrically connected to one of the circuits.

* * * * *